(12) United States Patent
Noot et al.

(10) Patent No.: US 10,908,513 B2
(45) Date of Patent: Feb. 2, 2021

(54) METROLOGY METHOD AND APPARATUS AND COMPUTER PROGRAM

(71) Applicant: ASML Netherlands B.V., Veldhoven (NL)

(72) Inventors: Marc Johannes Noot, Eindhoven (NL); Simon Gijsbert Josephus Mathijssen, Rosmalen (NL); Kaustuve Bhattacharyya, Veldhoven (NL); Jinmoo Byun, Seoul (KR); Hyun-Su Kim, Seong-Nam (KR); Won-Jae Jang, Gyeonggi-do (KR); Timothy Dugan Davis, Portland, OR (US)

(73) Assignee: ASML Netherlands B.V., Veldhoven (NL)

( * ) Notice: Subject to any disclaimer, the term of this patent is extended or adjusted under 35 U.S.C. 154(b) by 112 days.

(21) Appl. No.: 16/026,507

(22) Filed: Jul. 3, 2018

(65) Prior Publication Data
US 2019/0033727 A1    Jan. 31, 2019

Related U.S. Application Data

(60) Provisional application No. 62/609,111, filed on Dec. 21, 2017.

(30) Foreign Application Priority Data

Jul. 28, 2017 (EP) ..................... 17183849

(51) Int. Cl.
*G03F 7/20* (2006.01)

(52) U.S. Cl.
CPC .......... *G03F 7/70633* (2013.01); *G03F 7/705* (2013.01); *G03F 7/70516* (2013.01); *G03F 7/70616* (2013.01); *G03F 7/70625* (2013.01)

(58) Field of Classification Search
CPC .. G03F 7/705; G03F 7/70508; G03F 7/70516; G03F 7/70525; G03F 7/70533;
(Continued)

(56) References Cited

U.S. PATENT DOCUMENTS 7,873,585 B2 * 1/2011 Izikson ............... G03F 7/70625
706/21
9,869,940 B2 * 1/2018 Zeng .................. G03F 7/70633
(Continued)

FOREIGN PATENT DOCUMENTS

WO    WO 2009/078708 A1    6/2009
WO    WO 2009/106279 A1    9/2009
(Continued)

OTHER PUBLICATIONS

Amit, E. et al., "Overlay accuracy calibration" Proceedings Optical Diagnostics of Living Cells II, vol. 8681, Apr. 10, 2013; 6 pages.

*Primary Examiner* — Gordon J Stock, Jr.
(74) *Attorney, Agent, or Firm* — Sterne, Kessler, Goldstein & Fox P.L.L.C

(57) ABSTRACT

Disclosed are a method, computer program and a metrology apparatus for measuring a process effect parameter relating to a manufacturing process for manufacturing integrated circuits on a substrate. The method comprises determining for a structure, a first quality metric value for a quality metric from a plurality of measurement values each relating to a different measurement condition while cancelling or mitigating for the effect of the process effect parameter on the plurality of measurement values and a second quality metric value for the quality metric from at least one measurement value relating to at least one measurement condition without cancelling or mitigating for the effect of the process effect parameter on the at least one measurement value. The process effect parameter value for the process effect param-
(Continued)

eter can then be calculated from the first quality metric value and the second quality metric value, for example by calculating their difference.

19 Claims, 7 Drawing Sheets

(58) Field of Classification Search
CPC .............. G03F 7/7055; G03F 7/70558; G03F 7/70556; G03F 7/70575; G03F 7/70591; G03F 7/706; G03F 7/70608; G03F 7/70616; G03F 7/70625; G03F 7/70633; G03F 7/70641; G03F 7/7065; G03F 7/70683

See application file for complete search history.

(56) References Cited

U.S. PATENT DOCUMENTS

| | | | |
|---|---|---|---|
| 10,437,163 B2* | 10/2019 | Van Der Schaar | G01N 21/956 |
| 10,527,958 B2* | 1/2020 | Tinnemans | G03F 9/7023 |
| 2011/0027704 A1 | 2/2011 | Cramer et al. | |
| 2011/0043791 A1 | 2/2011 | Smilde et al. | |
| 2012/0242940 A1 | 9/2012 | Nagata et al. | |
| 2013/0035888 A1* | 2/2013 | Kandel | G03F 7/70616 702/81 |
| 2013/0308142 A1 | 11/2013 | Straaijer et al. | |
| 2014/0054186 A1 | 2/2014 | Riechers et al. | |
| 2014/0060148 A1* | 3/2014 | Amit | G01B 21/042 73/1.79 |
| 2016/0161864 A1* | 6/2016 | Middlebrooks | G03F 7/70633 355/67 |
| 2016/0313654 A1* | 10/2016 | Zeng | G01B 11/24 |
| 2017/0307983 A1* | 10/2017 | Den Boef | G03F 7/70633 |
| 2019/0049859 A1* | 2/2019 | Tsiatmas | G03F 7/70616 |
| 2019/0094703 A1* | 3/2019 | Jak | G03F 7/70575 |

FOREIGN PATENT DOCUMENTS

| | | |
|---|---|---|
| WO | WO 2011/012624 A1 | 2/2011 |
| WO | WO 2015/018625 A1 | 2/2015 |
| WO | WO 2016/083076 A1 | 6/2016 |
| WO | WO 2016/169901 A1 | 10/2016 |

* cited by examiner

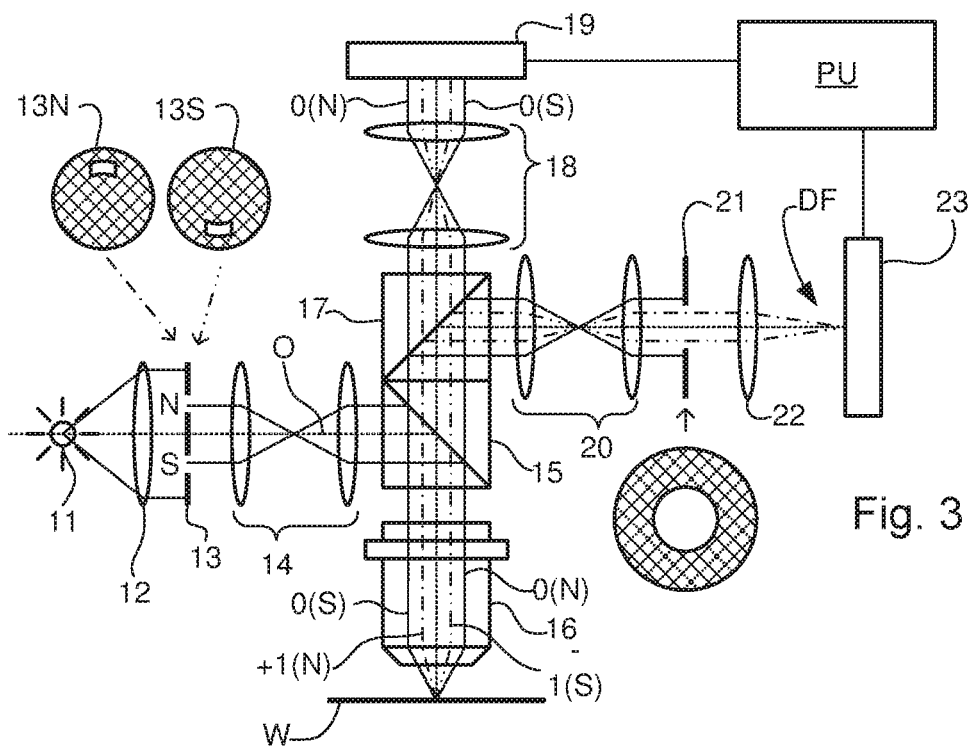
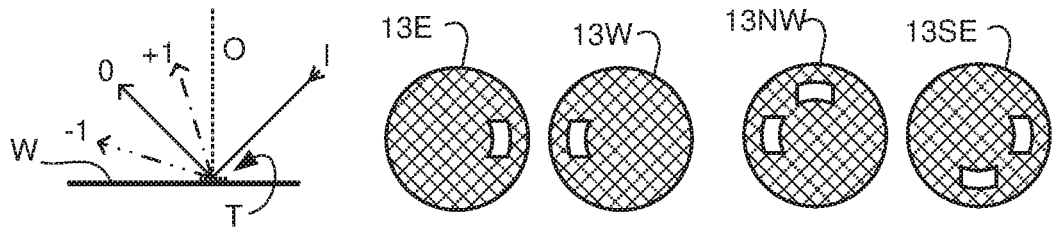
Fig. 3 (b)  Fig. 3 (c)  Fig. 3 (d)
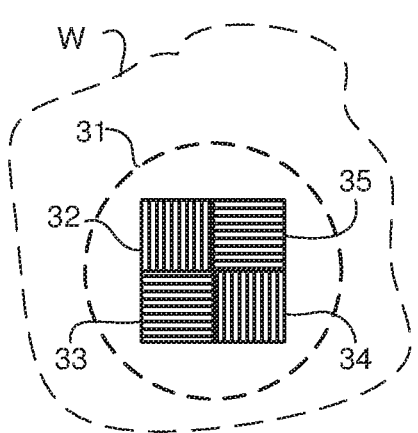
Fig. 4
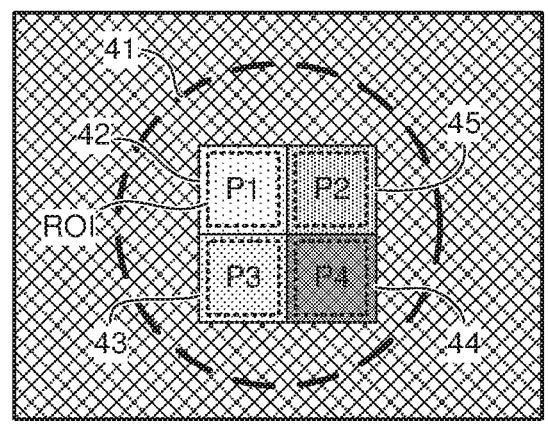
Fig. 5

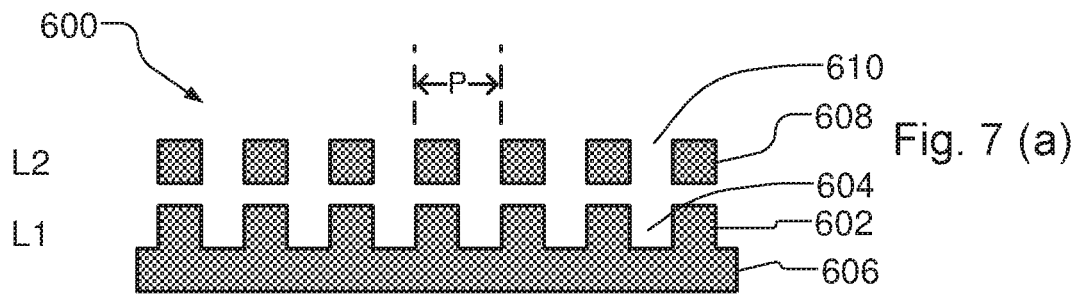
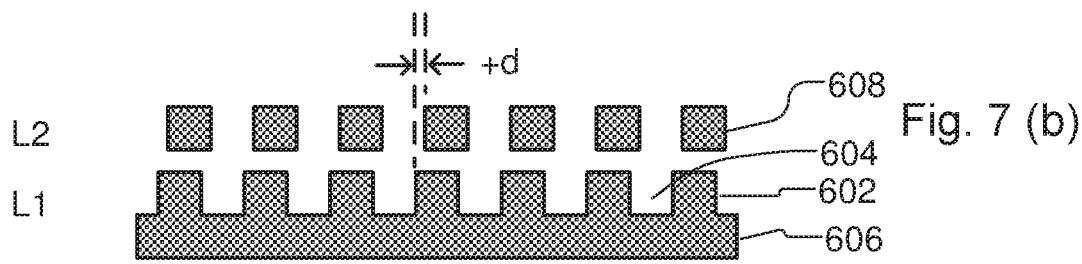
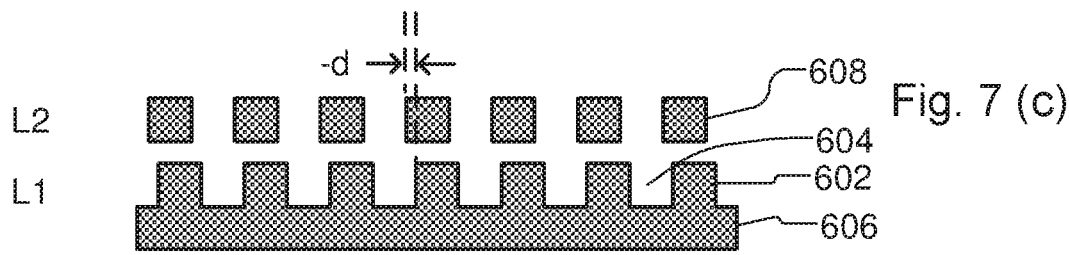
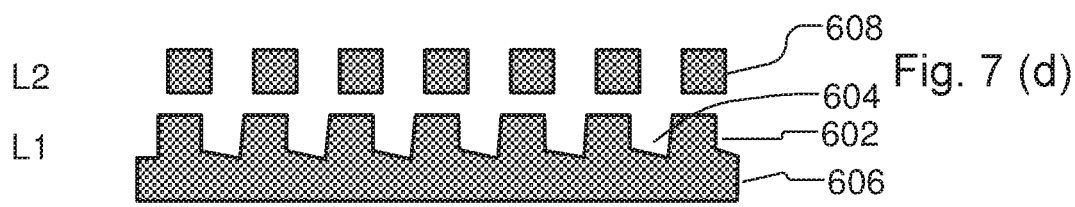
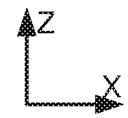

METROLOGY METHOD AND APPARATUS AND COMPUTER PROGRAM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242940A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. The intensity asymmetry, a comparison of these diffraction order intensities, for a given target provides a measurement of target asymmetry, that is asymmetry in the target. This asymmetry in the target can be used as an indicator of overlay (undesired misalignment of two layers).

Although the known dark-field image-based overlay measurements are fast and computationally very simple (once calibrated), they may rely on an assumption that layer misalignment (i.e., overlay error and/or deliberate bias) is the only cause of measured intensity asymmetry. Any other contributions to measured intensity asymmetry, such as any process effect within one or both of the overlaid gratings, also causes a contribution to intensity asymmetry in the $1^{st}$ (and other higher) orders. This intensity asymmetry contribution attributable to process effect, and which is not related to overlay, clearly perturbs the overlay measurement, giving an inaccurate overlay measurement. Asymmetry in the lowermost or bottom grating of a target is a common form of process effect. It may originate for example in wafer processing steps such as chemical-mechanical polishing (CMP), performed after the bottom grating was originally formed.

Being able to measure and quantify the process effect (e.g., structural asymmetry) can provide many benefits in monitoring the lithographic process. Therefore, it is desired to be able to measure and monitor such process effect in a more efficient way than presently done. More specifically it would be beneficial to be able to measure process effect directly from overlay targets.

SUMMARY OF THE INVENTION

The invention in a first aspect provides a method of measuring a process effect parameter relating to a manufacturing process for manufacturing integrated circuits on a substrate, the method comprising the steps of: determining for a structure, a first quality metric value for a quality metric from a plurality of measurement values each relating to a different measurement condition while cancelling or mitigating for the effect of the process effect parameter on the plurality of measurement values; determining for the structure, a second quality metric value for the quality metric from at least one measurement value relating to at least one measurement condition without cancelling or mitigating for the effect of the process effect parameter on the at least one measurement value; and calculating a process effect parameter value for the process effect parameter from said first quality metric value and said second quality metric value.

The invention in a second aspect provides a metrology apparatus comprising: a support for a substrate, said substrate having a structure formed thereon using a manufacturing process; an optical system for illuminating said structure with measurement radiation; a detector for detecting the measurement radiation scattered by the structure; and a processor configured to: determine for a structure, a first quality metric value for a quality metric from a plurality of measurement values each relating to a different measurement condition while cancelling or mitigating for the effect of the process effect parameter on the plurality of measurement values; determine for the structure, a second quality metric value for the quality metric from at least one measurement value relating to at least one measurement condition without cancelling or mitigating for the effect of the process effect parameter on the at least one measurement value; and calculate a process effect parameter value for the process effect parameter from said first quality metric value and said second quality metric value.

The invention further provides a computer program comprising processor readable instructions which, when run on suitable processor controlled apparatus, cause the processor controlled apparatus to perform the method of the first aspect and a computer program carrier comprising such a computer program. The processor controlled apparatus may comprise the metrology apparatus of the second aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprise 3(a) a schematic diagram of a dark field scatterometer for use in measuring targets according to embodiments of the invention using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIGS. 7(a) to 7(c) show schematic cross-sections of overlay gratings having different overlay values in the region of zero;

FIG. 7(d) is a schematic cross-section of an overlay grating having process effect (e.g., structural asymmetry) in a bottom grating due to processing effects;

DETAILED DESCRIPTION OF EXEMPLARY EMBODIMENTS

Before describing embodiments of the invention in detail, it is instructive to present an example environment in which embodiments of the present invention may be implemented.

Figure 1:
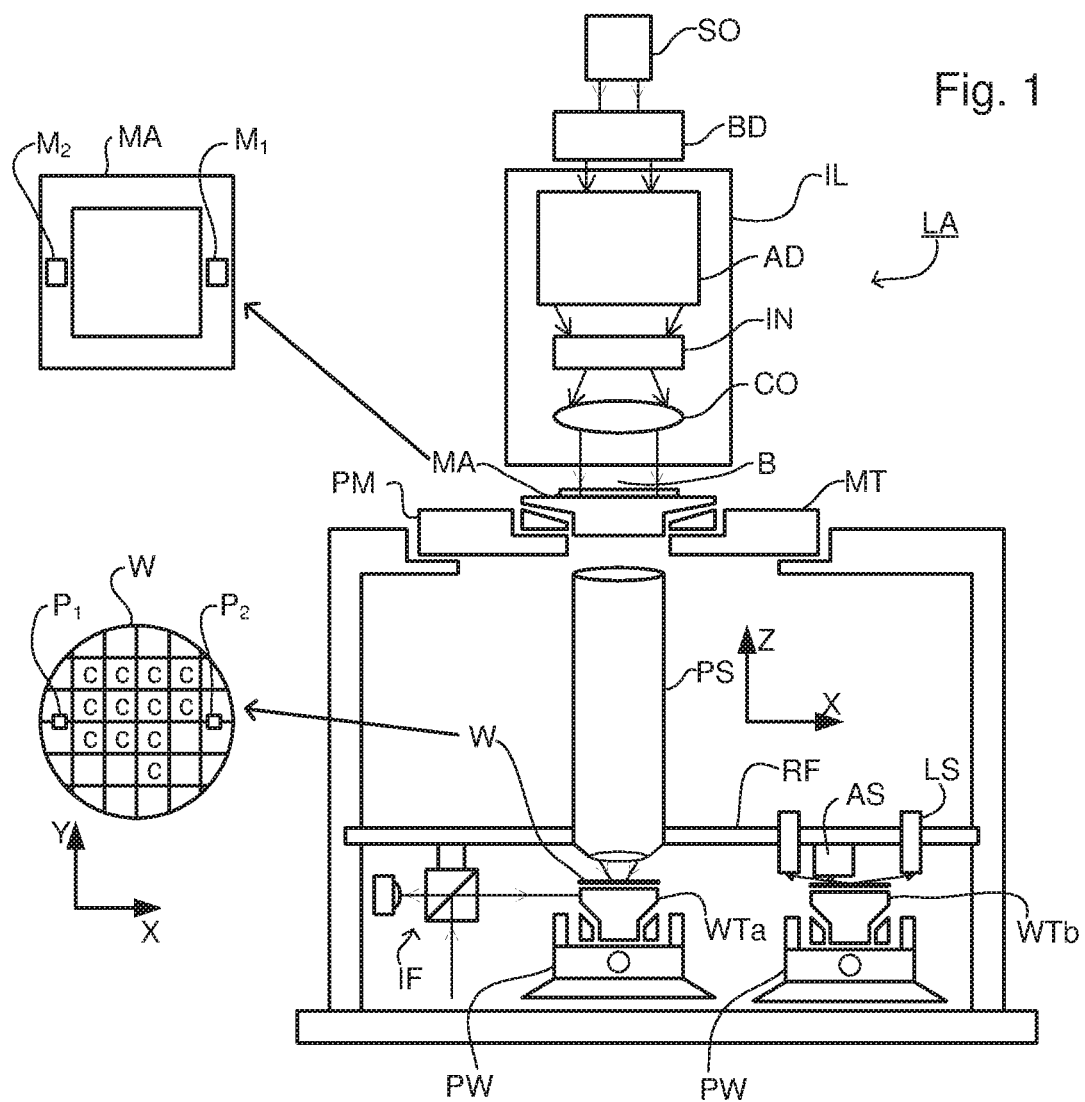
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
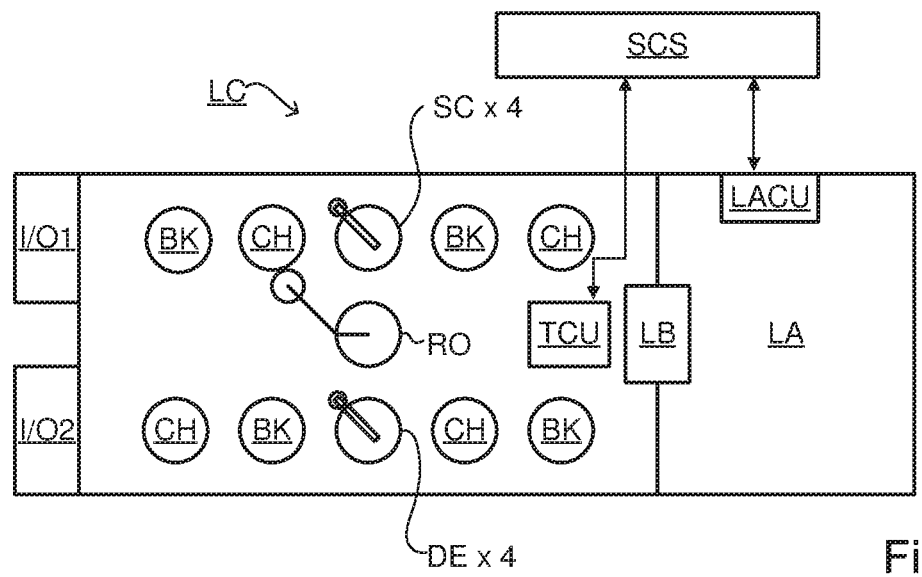
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus suitable for use in embodiments of the invention is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S), When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts a (composite) target formed on a substrate according to known practice. The target in this example comprises four gratings 32 to 35 positioned closely together so that they will all be within a measurement spot 31 formed by the metrology radiation illumination beam of the metrology apparatus. The four gratings thus are all simultaneously illuminated and simultaneously imaged on sensors 19 and 23. In an example dedicated to measurement of overlay, gratings 32 to 35 are themselves composite gratings formed by overlying sub-gratings that are patterned in different layers of the semi-conductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23. This is only one example of a target. A target may comprise more or fewer than 4 gratings, or only a single grating.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
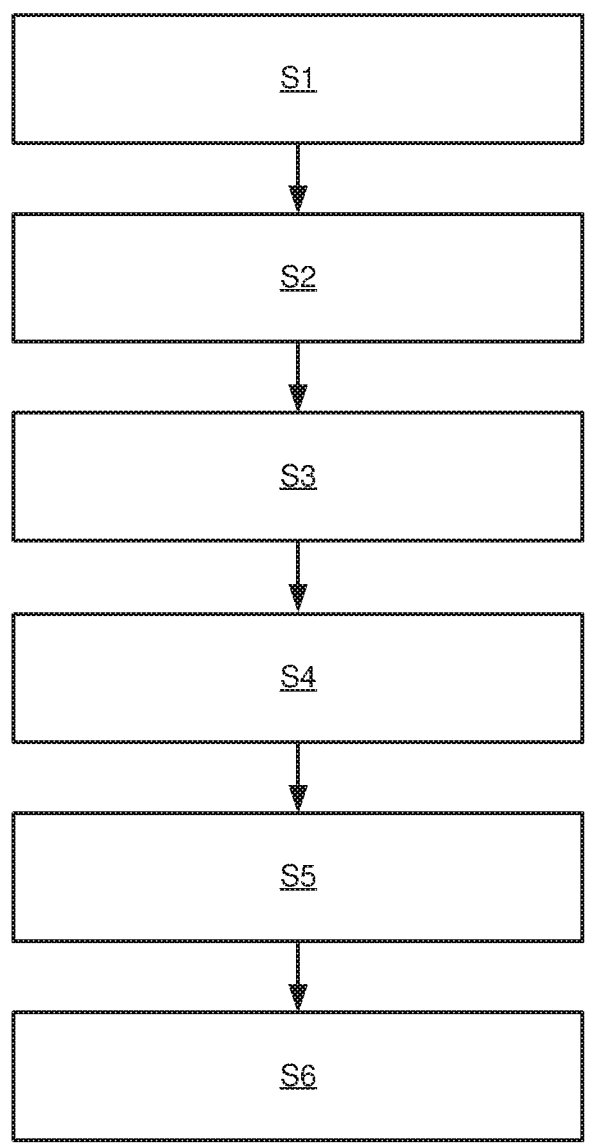
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay (i.e., undesired and unintentional overlay misalignment) between the two layers containing the component gratings 32 to 35 is measured. This measurement is done through target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor water, is processed through a lithographic apparatus, such as the lithographic cell of FIG. 2, one or more times, to create a target including the gratings 32-35. At S2, using the metrology apparatus of FIG. 3, an image of the gratings 32 to 35 is obtained using only one of the first order diffracted beams (say −1). At step S3, whether by changing the illumination mode, or changing the imaging mode, or by rotating substrate W by 180° in the field of view of the metrology apparatus, a second image of the gratings using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual target lines of the targets will not be resolved. Each target will be represented simply by an area of a certain intensity level. In step S4, a region of interest (ROI) is identified within the image of each component target, from which intensity levels will be measured.

Having identified the ROI for each individual target and measured its intensity, the asymmetry of the target, and hence overlay, can then be determined. This is done (e.g., by the processor PU) in step S5 comparing the intensity values obtained for +1 and −1 orders for each target 32-35 to identify their intensity asymmetry, e.g., any difference in their intensity. The term "difference" is not intended to refer only to subtraction. Differences may be calculated in ratio form. In step S6 the measured intensity asymmetries for a number of targets are used, together with knowledge of any known imposed overlay biases of those targets, to calculate one or more quality parameters of the lithographic process in the vicinity of the target T. In the applications described herein, measurements using two or more different measurement conditions or "recipes" will be included. A quality parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

FIG. 7 shows schematic cross sections of targets (overlay gratings), with different biases. These can be used as the target T on substrate W, as seen in FIGS. 3 and 4. Gratings with periodicity in the X direction are shown for the sake of example only. Different combinations of these gratings with different biases and with different orientations can be provided separately or as part of a target.

Starting with FIG. 7(a) a target 600 formed in two layers, labeled L1 and L2, is shown. In the lowermost or bottom layer L1, a first structure (the lowermost or bottom structure), for example a grating, is formed by features 602 and spaces 604 on a substrate 606. In layer L2 a second structure, for example a grating, is formed by features 608 and spaces 610. (The cross-section is drawn such that the features 602, 608 (e.g., lines) extend into the page.) The grating pattern repeats with a pitch P in both layers. Features 602 and 608 may take the form of lines, dots, blocks and via holes. In the situation shown at (a), there is no overlay contribution due to misalignment, e.g., no overlay and no imposed bias, so that each feature 608 lies exactly over a feature 602 in the first structure.

At FIG. 7(b), the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At (c) we see another feature with a second known imposed bias −d, such that the features of 608 are shifted to the left. Biased gratings of this type shown at (a) to (c) are well known in the art, and used in the prior applications mentioned above.

FIG. 7(d) shows schematically a phenomenon of process effect, in this case a process effect in the first structure (e.g., bottom grating asymmetry). The features in the gratings at (a) to (c), are shown as perfectly square-sided, when a real feature would have some slope on the side, and a certain roughness. Nevertheless they are intended to be at least symmetrical in profile. The features 602 and/or spaces 604 at (d) in the first structure no longer have a symmetrical form at all, but rather have become distorted by processing steps. Thus, for example, a bottom surface of each space has become tilted. Side wall angles of the features and spaces have become asymmetrical also. As a result of this, the overall target asymmetry of a target will comprise an overlay contribution independent of process effect (i.e., an overlay contribution due to misalignment of the first structure and second structure; itself comprised of overlay and any known imposed bias) and a structural contribution due to this process effect in the target.

When overlay is measured by the method of FIG. 6 using only two biased gratings, the process effect (e.g., process-induced structural asymmetry) cannot be distinguished from the overlay contribution due to misalignment, and overlay measurements become unreliable as a result. Structural asymmetry in the first structure (bottom grating) of a target is a common form of process effect. It may originate, for example, in the substrate processing steps such as chemical-mechanical polishing (CMP), performed after the first structure was originally formed. However, it is to be understood that this is only a single example of process effect. Process effect in the context of this specification may comprise any abnormality, deformity, defect, irregularity, structural asymmetry and/or other excursion from an intended parameter value in a structure formed in a single layer which may form part of a target (e.g., an overlay target) or an asymmetric variation in a target parameter such as layer thickness, which is separate to and distinct from overlay. Any process effect which results impacts overlay measurements (e.g., imposes a contribution to an intensity asymmetry measurement that is not the result of overlay), may be measured using the methods described herein. Process effect may be as a result of any processing and/or imaging effect, during any stage of a process performed to obtain processed substrates in an IC manufacturing process.

Figure 8:
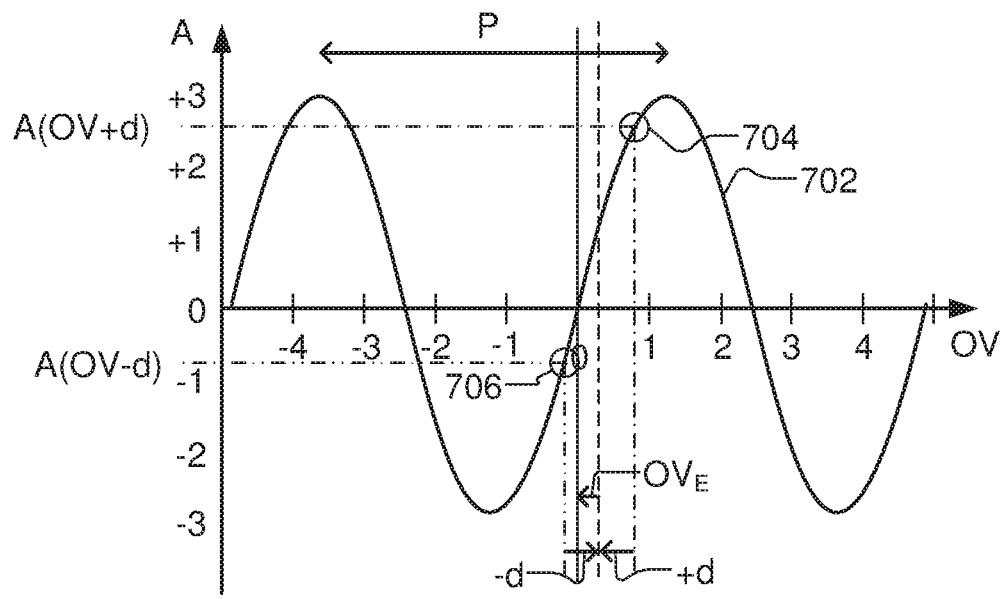
FIG. 8 illustrates known principles of overlay measurement in an ideal target, not subject to process effect.
Figure 9:
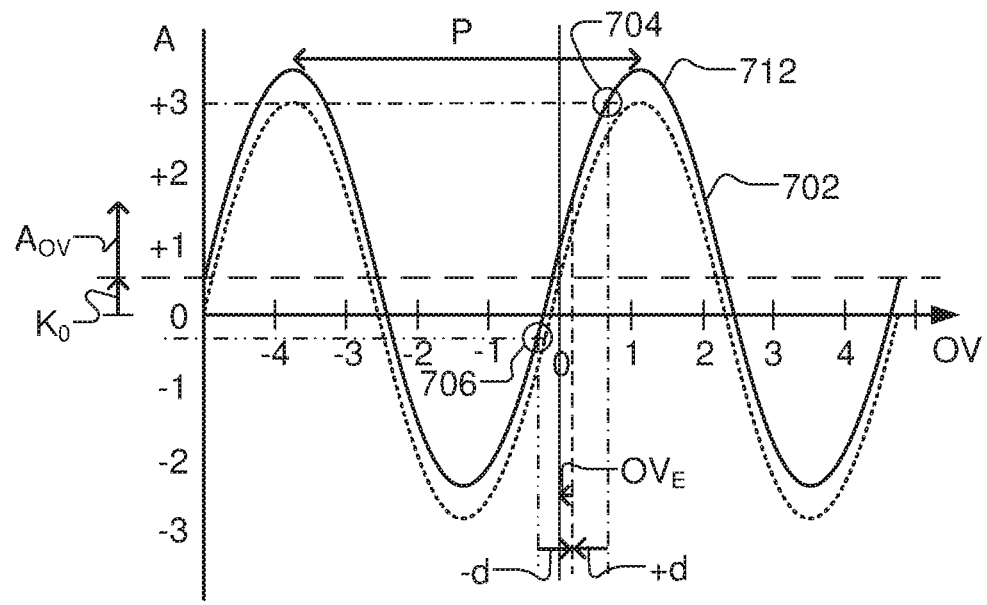
FIG. 9 illustrates a principle of overlay measurement in a non-ideal target, with correction of process effect as disclosed in embodiments of the invention.

In FIG. 8 a curve 702 illustrates the relationship between overlay OV and intensity asymmetry A for an 'ideal' target having zero offset and no process effect within the individual gratings forming the target, and in particular within the individual gratings of the first structure. Consequently, the target asymmetry of this ideal target comprises only an overlay contribution due to misalignment of the first structure and second structure resultant from a known imposed bias and overlay $OV_E$. This graph, and the graph of FIG. 9, is to illustrate the principles behind the disclosure only, and in each graph, the units of intensity asymmetry A and overlay OV are arbitrary. Examples of actual dimensions will be given further below.

In the 'ideal' situation of FIG. 8, the curve 702 indicates that the intensity asymmetry A has a non-linear periodic relationship (e.g., sinusoidal relationship) with the overlay. The period P of the sinusoidal variation corresponds to the period or pitch P of the gratings, converted of course to an appropriate scale. The sinusoidal form is pure in this example, but can include harmonics in real circumstances.

As mentioned above, biased gratings (having a known imposed overlay bias) can be used to measure overlay, rather than relying on a single measurement. This bias has a known value defined in the patterning device (e.g. a reticle) from which it was made, that serves as an on-wafer calibration of the overlay corresponding to the measured intensity asymmetry. In the drawing, the calculation is illustrated graphically in steps S1-S5, intensity asymmetry measurements $A^{+d}$ and $A^{-d}$ are obtained for gratings having imposed biases +d an −d respectively (as shown in FIGS. 7(b) and (c), for example). Fitting these measurements to the sinusoidal curve gives points 704 and 706 as shown. Knowing the biases, the true overlay $OV_E$ can be calculated. The pitch P of the sinusoidal curve is known from the design of the target. The vertical scale of the curve 702 is not known to start with, but is an unknown factor which can be referred to as a $1^{st}$ harmonic proportionality constant, $K_1$. This constant $K_1$ is a measure of the sensitivity of the intensity asymmetry measurements to the target.

In equation terms, the relationship between overlay $OV_E$ and intensity asymmetry A is assumed to be:

$$A_{\pm d} = K_1 \sin(OV_E \pm d) \qquad (1)$$

where overlay $OV_E$, is expressed on a scale such that the target pitch P corresponds to an angle $2\pi$ radians. Using two measurements of gratings with different, known biases (e.g. +d and −d) the overlay $OV_E$ can be calculated using:

$$OV_E = \operatorname{atan}\left(\frac{A_{+d} + A_{-d}}{A_{+d} - A_{-d}} \cdot \tan(d)\right) \qquad (2)$$

FIG. 9 shows a first effect of introducing process effect, for example the bottom grating asymmetry illustrated in FIG. 7(d). The 'ideal' sinusoidal curve 702 no longer applies. However, at least approximately, bottom grating asymmetry or other process effect has the effect of adding an process effect term $K_0$ to the intensity asymmetry $A_{\pm d}$. The resulting curve is shown as 712 in the diagram, with label $K_0$ indicating the process effect term. Process effect term $K_0$ is dependent upon a combination of the target and a selected characteristic of the measurement radiation, such as the wavelength and polarization of the measurement radiation (the measurement condition or measurement recipe), and is sensitive to process variations. In equation terms, the relationship used for calculation in step S6 becomes:

$$A_{\pm d} = K_0 + K_1 \sin(OV_E \pm d) \qquad (3)$$

Where there is process effect, the overlay model described by Equation (2) will provide overlay values which are impacted by the process effect term $K_0$, and will be inaccurate as a consequence. A number of different methods for cancelling or correcting for the effect of the process effect term are known. These comprise using additional targets and/or additional measurements with different measurement conditions. One such method, for example, is described in WO2015018625A1. An alternative method is described in WO2016169901A1. Both of these documents are hereby incorporated by reference.

It is often desirable to measure and quantify process effect in a structure or target. A process effect may comprise, for example, structural asymmetry such as bottom grating asymmetry BGA (as already described), grating imbalance or a combination of these. Grating imbalance is a variation in one or more layer thicknesses over a target area, which may result (for example) in an asymmetric variation in the distance between two gratings of a target over the target area. Quantifying process effect allows excursions to be detected, root causes to be determined and improvements to process control (e.g., control of processing steps such as etch and/or CMP) to be implemented. At present, it is not possible to measure process effect from overlay targets using a single measurement radiation condition. To directly measure the process effect, a methodology similar to standard overlay measurements (to obtain intensity asymmetries), as depicted in FIG. 6, is performed on a dedicated target, e.g., a target comprising only a single structure (a first structure or bottom grating). Of course, as there is only the single layer being measured, there cannot be any overlay and the +d and −d "bias" of the target is not real (without a second layer, the +d "biased" target and the −d "biased" target will be in fact identical). The bottom grating asymmetry BGA can then be calculated (per target) using:

$$BGA = \frac{I^+_{+d} - I^-_{+d} + I^+_{-d} - I^-_{-d}}{I^+_{+d} + I^-_{+d} + I^+_{-d} + I^-_{-d}} \qquad (4)$$

where I is the measured intensity, the + and − superscript denoting order of the measurement radiation beam and the +d and −d subscript denoting the target "bias" (e.g., $1^+_{+d}$ is the measured intensity when measuring a positively biased target using +1 order measurement illumination and $I_{+d}^-$ is the measured intensity when measuring a positively biased target using −1 order measurement illumination).

The use of specific process effect targets (whatever their form) to measure process effect, additional to those used to measure overlay, is undesirable as they take up substrate area or "real estate". To obtain process effect measurements over the substrate area and therefore a process effect fingerprint) a plurality of these process effect targets would be required. To obviate the need for such process effect targets, methods are disclosed herein which enable measurement of a process effect parameter in a structure without the need for a dedicated process effect target.

Figure 10:
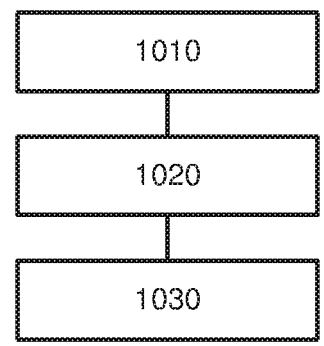
FIG. 10 is a flowchart of the steps of a method according to a first exemplary embodiment of the invention.

FIG. 10 is a flowchart describing such a method. The method comprises:

1010, obtaining a first quality metric value, more specifically a first overlay value relating to overlay of a structure, from a plurality of measurements, each measurement relating to a different measurement condition, while cancelling or mitigating for the effect of the process effect parameter on the plurality of measurement values.

1020, obtaining a second quality metric value, more specifically a second overlay value relating to overlay of the structure, from at least a single measurement relating to at least a single measurement condition, without cancelling or mitigating for the effect of the process effect parameter on the measurement value; and 1030, calculating a value for the process effect parameter describing a process effect in the structure from the difference of the first quality metric value and second quality metric value.

The first overlay value is calculated in such a way to mitigate, correct for and/or cancel the effect of process effect on the intensity asymmetry measurements and therefore the overlay measurement (e.g., the process effect term $K_0$). By contrast, the second overlay value is calculated in such a way that there is no equivalent mitigation for, correction for and/or cancellation of the effect of process effect on the intensity asymmetry measurements. This may be because only a single measurement value is used and therefore there is insufficient data to perform such mitigation. Alternatively multiple measurement values may be used to determine the second quality metric value without performing such mitigation. For example, the multiple measurement values may be averaged, with the average used as a single measurement value. Because the first overlay value is an overlay measurement corrected for process effect while the second overlay value is a corresponding overlay measurement of the same structure (therefore having the same overlay) which is not so corrected, the difference (process effect value) calculated at step 1030 will be the measurement contribution substantially attributable to process effect. The use of the term "substantially" here recognizes that that there will be other contributions present such as noise.

The different measurement conditions used to obtain the first overlay value may differ in terms of any one or more measurement parameters which will affect the overlay measurement. Such measurement parameters may include one or more of wavelength, polarization, angle of incidence etc.

A metrology apparatus, e.g., a scatterometry based metrology apparatus such as that shown in FIG. 3, may be provided with a radiation source which produces measurement radiation relating to more than one measurement condition. The measurement condition in this context describes one or more of wavelength and polarization of the measurement radiation to which a particular measurement value corresponds and/or the angle of incidence of the measurement radiation on the structure. More specifically, a metrology apparatus may have a dual wavelength, multiple wavelength or broadband (continuous over one or more wavelength ranges) radiation source. Alternatively, the source may be capable to switch between wavelengths, such as an optical system comprising filters which enable selection of a specific wavelength (e.g., controllable wavelength selector or selectable filters). Such an apparatus may enable the first overlay value to be obtained from a single measurement step comprising measurements relating to more than one measurement condition, e.g., using more than one wavelength. It should also be appreciated that the second overlay value may also use a measurement obtained from the same measurement step (e.g., one of the measurements used to obtain the first overlay value). Alternatively a second measurement step may be performed to obtain the second overlay value.

Figure 11:
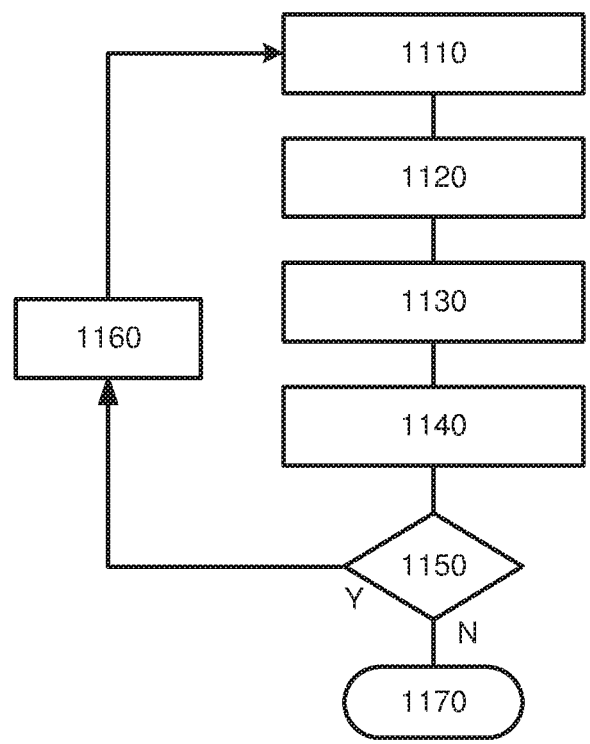
FIG. 11 is a flowchart of the steps of a method according to a second exemplary embodiment of the invention.

FIG. 11 is a flowchart describing a method of obtaining a process effect fingerprint according to such an embodiment. A process effect fingerprint is a map or description of process effect across a substrate. The process effect fingerprint may comprise a structural asymmetry fingerprint, or more specifically a bottom grating asymmetry fingerprint or grating imbalance fingerprint. It has been observed that the difference between the multi-recipe overlay and single recipe overlay across the substrate measured on overlay targets (comprising gratings in different layers) tends to show a similar fingerprint as a corresponding bottom grating asymmetry fingerprint measured on BGA targets.

At step 1110, using a suitable multiple wavelength metrology apparatus, a first target is measured with measurement radiation comprising at least two separate measurement conditions (e.g., different wavelength, polarization, angle of incidence etc . . . ) to obtain two or more corresponding measurements (e.g., intensity asymmetry measurements) of the target. At step 1120, a first overlay value is calculated from the two or more measurements, each measurement relating to a different measurement condition.

At step 1130, a second overlay value is calculated from at least a single one of the two or more measurements. The second overlay value may be calculated using:

one of the measurements used in step 1120 to calculate the first overlay value, a different one of the measurements obtained in measurement step 1110;

an average of the measurements used in step 1120 to calculate the first overlay value; or an average of a different subset, or all, of the measurements obtained in measurement step 1110.

At step 1140 (which corresponds to step 1030), the difference between the second overlay value and first overlay value is calculated as a value for the process effect parameter. At step 1150 it is determined whether any further targets are to be measured. If so, the next target is selected 1160 and the method returns to step 1110 for this next target. If there are no further targets the method ends 1170.

Determining a first overlay value using more than one measurements, each with different wavelengths, may be performed in a number of ways. For example, a suitable method is described in the aforementioned WO2015018625A1. This method relies on the fact that by having two (or more) different measurements, and therefore two intensity asymmetry measurement values, each obtained for example using the method described in relation to FIG.

6 but for a different measurement condition, there is sufficient information to solve equation (3) for the +d and −d biased target gratings. For example, the effect of the effect of process effect term $K_0$ can be cancelled. Determining the second overlay value may be performed, for example, from a single measurement value or single averaged measurement value using the method described in FIG. 6 and Equation (1)/Equation (2), thereby ignoring the effect of process effect term $K_0$.

Selection of the measurement conditions from which the first and second overlay values are determined may be performed in a number of ways. For example, where the measurement radiation source emits more than two wavelengths or a continuous band, a "swing curve" may be used to select the measurement conditions. A swing curve may comprise a plot of a measurement parameter against wavelength. Suitable measurement parameters for such a swing curve plot may comprise intensity, signal strength, stack sensitivity or overlay sensitivity for example. From one or more such swing curves, two or more wavelengths may be selected which show the best response for obtaining the first overlay value. One, or an average, of these wavelengths may also be used to obtain the second overlay value. Multiple swing curves may be plotted for different polarizations and/or angles of incidence, and used in such a measurement condition optimization to optimize for wavelength, polarization and angle of incidence.

The result of the methods described herein, for example a fingerprint as determined using the method of FIG. 11 or individual process effect parameter values, can be used in a number of ways. A fingerprint or process effect parameter value may be used to detect excursions, where such process effects fall out of specification and therefore trigger warnings. Such a fingerprint or process effect parameter may also enable process related root causes for any process effect, to identify any root cause for the process effect. The process effect parameter values or fingerprint may be used in process control for a particular process (for example an etch or CMP process). For example, any measured process effect values or fingerprint may be used to calculate process control corrections which minimize the process effect values in subsequent repetitions of the process in a feedback control loop.

In the above description, it is proposed that the first overlay value is obtained using the method described in WO2015018625A1. Represented graphically, this method essentially describes calculating overlay by measuring a composite target under more than one measurement condition and plotting these measurements on a graph in asymmetry space. In this context, asymmetry space comprises a plot of an intensity asymmetry measurement from the positively biased (+d) target ($A^{+d}$ measurement) against an intensity asymmetry measurement from the negatively biased (−d) target ($A^{-d}$ measurement) for each measurement condition. A regression is fitted through each point on the asymmetry space plot (but not necessarily the origin), and the slope of the regression is indicative of overlay. The method described in WO2015018625A1 relies on the assumption that the relationship between the $A^{+d}$ measurements and $A^{-d}$ measurements are substantially linear. However, the concepts described herein are not limited to methods which use linear models, and non-linear extended models may be used and compared instead.

For example, the methods disclosed above assume that for calculation of the first overlay value, e.g., an overlay value obtained using (at least) two measurement conditions, the points relating to the two measurement conditions used will yield measurements which lie substantially on a regression indicative of overlay (i.e., on substantially the same line as the majority of other measurements performed under different measurement conditions). This regression could then be parallel (for a linear model example) to a second regression plotted through the origin and a point relating to the single measurement condition used to determine the second overlay value, with their offset being representative of the process effect.

In reality, points in asymmetry space relating to some measurement conditions may deviate significantly from the overlay line and/or the $A^{+d}/A^{-d}$ may be substantially non-linear for a particular set of measurement conditions or target. Should one of these measurement conditions be used to obtain an overlay value to obtain the first overlay value in the method above), then the overlay value obtained will be unreliable. However, when monitoring overlay during device manufacture, it would be prohibitively slow to measure a full range of 20 or more measurements, each relating to a different measurement condition, so as to ensure a good fit and therefore reliable overlay value. Therefore, it is important that the small subset of two or three measurement conditions that are used for overlay monitoring are well chosen as being representative of overlay.

In an embodiment therefore, it is proposed to monitor the reliability of an overlay measurement based on a small number of measurements by determining a difference (a monitor metric parameter value) between a first monitor quality metric value (more specifically a first monitor overlay value) obtained from a first regression model determined from a first set of measurements and a second monitor quality metric value (more specifically a second monitor overlay value) obtained from a second regression model determined from second set of measurements, each of these sets of measurements relating to a different plurality of measurement conditions.

In a more specific example, the first set of measurements may relate to at least three measurement conditions, and the second set of measurements may relate to fewer measurement conditions than the first set, but typically more than one. However, it should be noted that the disclosure herein includes basing a regression on only one measurement condition and therefore only one measurement, plotted through the origin. The second set of measurements may comprise a subset of the first set of measurements. Alternatively, the first and second sets of measurement conditions may relate to different pairs of measurement conditions.

It will be appreciated that the both the first and second regressions should monitor overlay values should be substantially the same. Any difference in the first and second monitor overlay values is therefore indicative of the presence of model-errors in the chosen subset, and therefore indicative of a non-ideal selection of measurement conditions. Also, the magnitude of such a difference is indicative of the degree of model-error.

Therefore, it can be appreciated that a measure of process effect may be determined from the difference between an overlay value determined from at least two measurement conditions and an overlay value determined from a single measurement condition (e.g., using a method such as that illustrated in FIG. 11), while the difference between two overlay values obtained from different combinations of multiple measurement conditions will provide a measure of the quality of the overlay model being relied upon, and therefore the validity of the overlay value determined.

In a specific embodiment, the first monitor overlay value can be obtained from a regression fitted to three measurement conditions and the second monitor overlay value can be obtained from a regression fitted to a subset comprising two of the three measurement conditions. This means that the overlay validity can be determined from only three measurements. The difference between the first and second monitor overlay values can then be monitored as a measure of the validity of the overlay model; for example should this difference exceed a threshold, this may be deemed indicative that the model is invalid with the measurement conditions used and that corrective action is required (e.g., better selection of measurement conditions).

The method may comprise a set-up phase to optimize selection of the three (or more) measurement conditions used to obtain the first monitor overlay value. The set-up phase may further optimize the selection of the subset of these measurement conditions used to obtain the second monitor overlay value.

Figure 12:
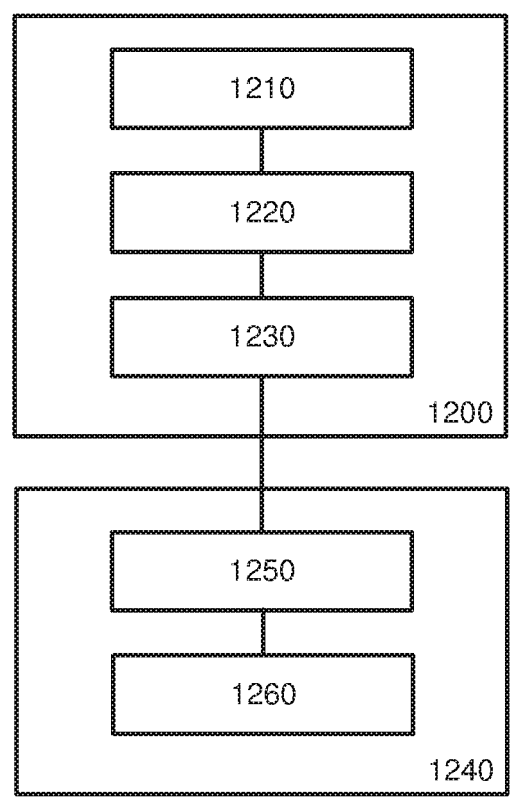
FIG. 12 is a flowchart of the steps of a method according to a third exemplary embodiment of the invention.

FIG. 12 is a flowchart describing such a method. In a set-up phase 1200, a reference overlay value may be created 1210. Such a reference overlay value may be determined from measurements performed using a significantly more than three measurement conditions, e.g., more than 10 or more than 20 measurement conditions. The reference overlay value may be obtained as a regression through points relating to these measurements, or using an extended overlay model. Alternatively the reference overlay value may be obtained via a different metrology technique (e.g., a scanning electron microscope measurement).

At step 1220, the three (or however many) measurement conditions which best match the reference may be determined. This may comprise calculating an overlay value for each possible combination of three measurement conditions out of all the measurement conditions used in step 1210. Each of these overlay values may be compared to the reference overlay value, with the combination corresponding to the closest of match chosen. At step 1230, an overlay value corresponding to each subset pair of measurement conditions comprised within the three best measurement conditions (identified in the previous step) is determined. For each of these subset pairs, the difference of the overlay determined from all three measurement conditions and the overlay corresponding to the subset pair is determined The best subset pair of measurement conditions out of those identified in step 1220 can then be identified (e.g., as that for which the overlay difference is smallest).

During production 1240, measurements are performed 1250 using only the measurement conditions identified at step 1220. Using these measurements, the difference between a first monitor overlay value derived from measurements under all three measurement conditions and a second monitor overlay value derived from the best subset pair of measurement conditions determined at step 1230 is monitored 1260 to determine the validity of the overlay as measured during production (e.g., from the best subset pair).

The concepts described herein for determining process effect and for monitoring overlay measurement validity may be combined, e.g., to determine the effect of a particular process effect of a target on validity of an overlay measurement on that target. Therefore, the method described by the flowchart of FIG. 12 may also comprise determining the difference between one of the first and second monitor overlay values, and an overlay value derived from a measurement under a single measurement condition (or otherwise without cancelling or mitigating for the effect of the process effect parameter on the measurement value) to determine the process effect parameter.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the methods disclosed herein.

While the embodiments disclosed above are described in terms of diffraction based overlay measurements (e.g., measurements made using the second measurement branch of the apparatus shown in FIG. 3(*a*)), in principle the same models can be used for pupil based overlay measurements (e.g., measurements made using the first measurement branch of the apparatus shown in FIG. 3(*a*)). Consequently, it should be appreciated that the concepts described herein are equally applicable to diffraction based overlay measurements and pupil based overlay measurements.

A further disclosed embodiment is a method of measuring a process effect parameter relating to a manufacturing process for manufacturing integrated circuits on a substrate, the method comprising the steps of: a) determining for a structure, a first quality metric value for a quality metric from a plurality of measurement values each relating to a different measurement condition while cancelling or mitigating for the effect of the process effect parameter on the plurality of measurement values; b) determining for the structure, a second quality metric value for the quality metric from at least one measurement value relating to at least one measurement condition without cancelling or mitigating for the effect of the process effect parameter on the at least one measurement value; and calculating a process effect parameter value for the process effect parameter from said first quality metric value and said second quality metric value.

Embodiments are also disclosure in the subsequent numbered clauses:

1. A method of measuring a process effect parameter relating to a manufacturing process for manufacturing integrated circuits on a substrate, the method comprising the steps of:
   determining for a structure, at least one first quality metric value for a quality metric from a set of measurement values relating to at least a first set of measurement conditions, such that each measurement value relates to a different measurement condition;

determining for the structure, a second quality metric value for the quality metric from at least one measurement value relating to at least one measurement condition; and calculating a process effect parameter value for the process effect parameter using said first quality metric value and said second quality metric value.

2. A method of clause 1, wherein the step of calculating a process effect parameter value comprises calculating the difference of said first quality metric value and said second quality metric value.

3. A method of clause 1 or 2, wherein
the determining of the first quality metric values is performed while cancelling or mitigating for the effect of the process effect parameter on the set of measurement values,
the determining of the second quality metric values is performed without cancelling or mitigating for the effect of the process effect parameter on the at least one measurement value 4. A method of clause 3, comprising:
determining a set of said first quality metric values, each of said first quality metric values being determined from a different set of measurement values, each value of which relating to a different measurement condition;
determining a monitor metric parameter value from a difference between a pair of said first quality metric values; and
monitoring the validity of said first quality metric value and/or said second quality metric value using said monitor metric parameter value.

5. A method of clause 4, wherein each quality metric; value of the pair of first quality metric values is determined from a different number of measurement values.

6. A method of clause 5, wherein the measurement values used to determine one of said pair of first quality metric values is a subset of the measurement values used to determine the other of said pair of first quality metric values.

7. A method of any of clauses 4, 5 or 6 comprising performing an initial calibration comprising:
determining a reference value for said quality metric;
calculating calibration values for said quality metric for a plurality of different combinations of measurement conditions;
determining a preferred combination of measurement conditions as that having a corresponding calibration value which best matches most closely the reference value; and
selecting a preferred subset of measurement conditions out of said preferred combination of measurement conditions.

8. A method of any preceding clause, wherein said quality metric is overlay.

9. A method of clause 8, wherein said structure comprises an overlay target.

10. A method of clause 9, wherein said overlay target comprises at least two gratings, each grating comprising:
a sub-grating in each of two layers; and
a positional bias between the two sub-gratings;
wherein the positional bias is different for the two gratings.

11. A method of any preceding clause, wherein the set of measurement values used in determining the first quality metric value and the at least one measurement value used in determining the second quality metric value are all obtained in a single measurement step comprising multiple measurements on said structure using different measurement conditions.

12. A method of clause 11, wherein the single measurement step comprises performing a measurement on the structure using measurement radiation comprising more than one wavelength and/or polarization and/or incident on the structure at more than one angle of incidence to obtain at least a subset of said set of measurement values simultaneously.

13. A method of any preceding clause, wherein a single measurement value relating to a single measurement condition is used in determining the second quality metric value.

14. A method of clause 13 wherein said single measurement value is the same as one of the different measurement values used in determining the first quality metric value.

15. A method of any of clauses 1 to 13, wherein the second quality metric value is determined from an average of two or more quality metric values that are individually determined from one of said set of measurement values.

16 A method of clause 15, the set of measurement values averaged to obtain said second quality metric are the same as the set of measurement values used in determining the first quality metric value.

17. A method of any preceding clause, wherein said process effect comprises structural asymmetry.

18. A method of clause 17, wherein said sub-structure comprises a grating and said structural asymmetry comprises grating asymmetry wherein one or more structural features of said grating has an asymmetric profile.

19. A method of clause 17 or 18, wherein said structure comprises at least two sub-structures in different layers and said structural asymmetry comprises an asymmetric variation in thickness between the at least two sub-structures.

20. A method of any preceding clause, comprising using said process effect parameter value to detect an excursion where said process effect parameter has fallen outside of a specified tolerance.

21. A method of any preceding clause, comprising using said process effect parameter value in process control for a sub-process forming part of the manufacturing process in a feedback control loop.

22. A method of any preceding clause, comprising performing the method on a plurality of said targets at different locations on the substrate to obtain a plurality of process effect parameter values; and
determining a process effect parameter fingerprint describing variation of the process effect parameter across the substrate from said plurality of process effect parameter values.

23. A method of clause 22, further comprising using said process effect parameter fingerprint to detect excursions where one or more of said process effect parameters have fallen outside of a specified tolerance.

24. A method of clause 22 or 23, further comprising using said process effect parameter fingerprint in process control for a sub-process forming part of the manufacturing process in a feedback control loop.

25. A method of any preceding clause wherein said measurement radiation condition describes one or more of wavelength and polarization of the measurement radiation to which a particular measurement value corresponds and/or the angle of incidence of the measurement radiation on the structure.

26. A method of any preceding clause comprising:
   illuminating the structure with measurement radiation and detecting the measurement radiation scattered by the structure; and
   measuring intensity asymmetry in corresponding higher orders of the scattered measurement radiation;
   wherein said set of measurement values and said at least one measurement value each comprise values of said measured intensity asymmetry.

27. A metrology apparatus being operable to perform the method of clause 22.

28. A metrology apparatus comprising:
   a support for a substrate, said substrate having a structure formed thereon using a manufacturing process;
   an optical system for illuminating said structure with measurement radiation;
   a detector for detecting the measurement radiation scattered by the structure; and
   a processor configured to:
      determine for a structure, a first quality metric value for a quality metric from a set of measurement values each relating to a different measurement condition;
      determine for the structure, a second quality metric value for the quality metric from at least one measurement value relating to at least one measurement condition; and
      calculate a process effect parameter value for the process effect parameter from said first quality metric value and said second quality metric value.

29. A metrology apparatus of clause 28, wherein said processor is configured to determine the first quality metric values while cancelling or mitigating for the effect of the process effect parameter on the set of measurement values, and to determine the second quality metric values without cancelling or mitigating for the effect of the process effect parameter on the at least one measurement value 30. A metrology apparatus of clause 28 or 29, wherein said processor is configured to calculate said process effect parameter value by calculating the difference of said first quality metric value and said second quality metric value.

31. A metrology apparatus of any of clauses 28 to 30, wherein said quality metric is overlay.

32. A metrology apparatus of clause 31, wherein said structure comprises an overlay target.

33. A metrology apparatus of clause 32, wherein said overlay target comprises two gratings, each grating comprising:
   a sub-grating in each of two layers; and
   a positional bias between the two sub-gratings;
   wherein the positional bias is different for the two gratings.

34. A metrology apparatus of any of clauses 28 to 33, configured to obtain the set of measurement values used in determining the first quality metric value and the at least one measurement value used in determining the second quality metric value from a single measurement step comprising multiple measurements on said structure using different measurement conditions.

35. A metrology apparatus of clause 34, configured such that said single measurement step comprises performing a measurement on the structure using measurement radiation comprising more than one wavelength and/or polarization and/or incident on the structure at more than one angle of incidence to obtain at least a subset of said set of measurement values simultaneously.

36. A metrology apparatus of any of clauses 28 to 35, wherein the processor is configured to use a single measurement value relating to a single measurement condition in determining the second quality metric value.

37. A metrology apparatus of clause 36, wherein said single measurement value is the same as one of the different measurement values used in determining the first quality metric value.

38. A metrology apparatus of any of clauses 28 to 35, the processor is configured to determine the second quality metric value from an average of at least two quality metric values that are individually determined from one of said set of measurement values.

39. A metrology apparatus of clause 38, wherein the processor is configured such that the set of measurement values averaged to obtain second quality metric are the same as the set of measurement values used in determining the first quality metric value.

40. A metrology apparatus of any of clauses 28 to 39, wherein said process effect comprises structural asymmetry.

41. A metrology apparatus of clause 40, wherein said sub-structure comprises a grating and said structural asymmetry comprises grating asymmetry wherein one or more structural features of said grating has an asymmetric profile.

42. A metrology apparatus of clause any of clauses 28 to 41, wherein said structure comprises at least two sub-structures in different layers and said structural asymmetry comprises an asymmetric variation in thickness between the at least two sub-structures.

43. A metrology apparatus of any of clauses 28 to 42, being configured to:
   measure a plurality of said targets at different locations on the substrate; and
   determine a process effect parameter fingerprint describing variation of the process effect parameter across the substrate from said measurements.

44. A metrology apparatus of any of clauses 28 to 43, wherein said measurement radiation condition describes one or more of wavelength and polarization of the measurement radiation to which a particular measurement value corresponds and/or the angle of incidence of the measurement radiation on the structure.

45. A computer program comprising processor readable instructions which, when run on suitable processor controlled apparatus, cause the processor controlled apparatus to perform the method of any one of clauses 1 to 27.

46. A computer program carrier comprising the computer program of clause 45.

47. A method of measuring a quality metric relating to a manufacturing process for manufacturing integrated circuits on a substrate, the method comprising the steps of:
   determining for a structure, a first quality metric value for the quality metric from a first set of measurement values relating to a first set of measurement conditions, such that each measurement value relates to a different measurement condition;
   determining for the structure, a second quality metric value for the quality metric from a second set of measurement values relating to a second set of measurement conditions, such that each measurement value relates to a different measurement condition; and
   comprising monitoring the validity of said first quality metric value and/or said second quality metric value using a monitor metric parameter value determined from the difference of said first quality metric value and said second quality metric value.

48. A method of clause 47, wherein each of said first quality metric value and said second quality metric value is determined from a different number of measurement values.

49. A method of clause 48, wherein said quality metric is overlay.
   wherein the measurement values used to determine first quality metric value is a subset of the measurement values used to determine the second quality metric value.

50. A method of any of clauses 47, 48 or 49, comprising performing an initial calibration, said initial calibration comprising:
   determining a reference value for said quality metric;
   calculating calibration values for said quality metric for a plurality of different combinations of measurement conditions;
   determining a preferred combination of measurement conditions as that having a corresponding calibration value which best matches most closely the reference value; and
   selecting a preferred subset of measurement conditions out of said preferred combination of measurement conditions.

51. A method of any of clauses 47 to 50, wherein said quality metric is overlay.

52. A method of any of clauses 47 to 51, comprising:
   illuminating the structure with measurement radiation and detecting the measurement radiation scattered by the structure; and
   measuring intensity asymmetry in corresponding higher orders of the scattered measurement radiation;
   wherein said first and second set of measurement values each comprise values of said measured intensity asymmetry.

53. A metrology apparatus being operable to perform the method of clause 52.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring, using a metrology apparatus, a process effect parameter relating to a manufacturing process for manufacturing integrated circuits on a substrate having a structure, the method comprising:
   determining, for the structure, using a processor, at least one first quality metric value for a quality metric from a set of measurement values relating to at least a first set of measurement conditions of the metrology apparatus, such that each measurement value relates to a different measurement condition, while cancelling or mitigating an effect of the process effect parameter on the set of measurement values;
   determining, for the structure, a second quality metric value for the quality metric from at least one measurement value relating to at least one measurement condition without cancelling or mitigating the effect of the process effect parameter on the at least one measurement value; and
   calculating a process effect parameter value for the process effect parameter using the first quality metric value and the second quality metric value.

2. The method of claim 1, wherein the step of calculating a process effect parameter value comprises calculating a difference of the first quality metric value and the second quality metric value.

3. The method of claim 1, wherein:
   a single measurement value relating to a single measurement condition is used in determining the second quality metric value; and
   the single measurement value is the same as one of the different measurement values used in determining the first quality metric value.

4. The method of claim 1, wherein the second quality metric value is determined from an average of two or more quality metric values that are individually determined from one of the set of measurement values.

5. The method of claim 1, wherein:
   the process effect comprises structural asymmetry; and
   the structure comprises a grating and the structural asymmetry comprises grating asymmetry wherein one or more structural features of the grating has an asymmetric profile.

6. The method of claim 1, comprising using the process effect parameter value to detect an excursion where the process effect parameter has fallen outside of a specified tolerance.

7. The method of claim 1, further comprising using the calculated process effect parameter value to adjust a parameter of the measuring method or the manufacturing process.

8. The method of claim 1, wherein:
   the quality metric is overlay; and
   the structure comprises an overlay target.

9. The method of claim 8, wherein the overlay target comprises at least two gratings, each grating comprising:
   a sub-grating in each of two layers; and
   a positional bias between the two sub-gratings;
   wherein the positional bias is different for the two gratings.

10. The method of claim 1, wherein the set of measurement values used in determining the first quality metric value and the at least one measurement value used in determining the second quality metric value are all obtained in a single measurement step comprising multiple measurements on the structure using different measurement conditions.

11. The method of claim 10, wherein the single measurement step comprises performing a measurement on the structure using measurement radiation comprising more than one wavelength, more than one polarization, and/or more than one angle of incidence on the structure to obtain at least a subset of the set of measurement values simultaneously.

12. The method of claim 1, further comprising:
determining a set of the first quality metric values, each of the first quality metric values being determined from a different set of measurement values, each value of which relating to a different measurement condition;
determining a monitor metric parameter value from a difference between a pair of the first quality metric values; and
monitoring a validity of the at least one first quality metric value and/or the second quality metric value using the monitor metric parameter value.

13. The method of claim 12, comprising performing an initial calibration comprising:
determining a reference value for the quality metric;
calculating calibration values for the quality metric for a plurality of different combinations of measurement conditions;
determining a combination of measurement conditions corresponding to a calibration value that most closely matches the reference value; and
selecting a subset of measurement conditions out of the combination of measurement conditions.

14. The method of claim 12, wherein each quality metric value of the pair of first quality metric values is determined from a different number of measurement values.

15. The method of claim 14, wherein the measurement values used to determine one of the pair of first quality metric values is a subset of the measurement values used to determine the other of the pair of first quality metric values.

16. A metrology apparatus comprising:
a support for a substrate, the substrate having a structure formed thereon using a manufacturing process, wherein a process effect parameter is associated with the manufacturing process;
an optical system for illuminating the structure with measurement radiation;
a detector for detecting the measurement radiation scattered by the structure; and
a processor configured to:
determine, for the structure, a first quality metric value for a quality metric from a set of measurement values relating to a corresponding set of different measurement conditions while cancelling or mitigating an effect of the process effect parameter on the set of measurement values;
determine, for the structure, a second quality metric value for the quality metric from at least one measurement value relating to at least one measurement condition without cancelling or mitigating the effect of the process effect parameter on the at least one measurement value; and
calculate a process effect parameter value for the process effect parameter from the first quality metric value and the second quality metric value.

17. A non-transitory computer program carrier comprising processor readable instructions which, when run on suitable processor controlled apparatus, cause the processor controlled apparatus to perform a method of measuring a process effect parameter relating to a manufacturing process for manufacturing integrated circuits on a substrate, the method comprising the steps of:
determining, for a structure, at least one first quality metric value for a quality metric from a set of measurement values relating to at least a first set of measurement conditions, such that each measurement value relates to a different measurement condition, while cancelling or mitigating an effect of the process effect parameter on the set of measurement values;
determining, for the structure, a second quality metric value for the quality metric from at least one measurement value relating to at least one measurement condition without cancelling or mitigating the effect of the process effect parameter on the at least one measurement value; and
calculating a process effect parameter value for the process effect parameter using the first quality metric value and the second quality metric value.

18. A method of measuring, using a metrology apparatus, a quality metric relating to a process effect parameter associated with a manufacturing process for manufacturing integrated circuits on a substrate, the method comprising the steps of:
determining, for a structure, a first quality metric value for the quality metric from a first set of measurement values relating to a corresponding first set of different measurement conditions of the metrology apparatus while cancelling or mitigating an effect of the process effect parameter on the first set of measurement values;
determining, for the structure, a second quality metric value for the quality metric from a second set of measurement values relating to a corresponding second set of different measurement conditions of the metrology apparatus without cancelling or mitigating the effect of the process effect parameter on the second set of measurement values; and
monitoring a validity of the first quality metric value and/or the second quality metric value using a monitor metric parameter value determined from a difference of the first quality metric value and the second quality metric value.

19. The method of claim 18, wherein each of the first quality metric value and the second quality metric value is determined from a different number of measurement values.

* * * * *